United States Patent [19]

Uchino et al.

[11] Patent Number: 4,985,344

[45] Date of Patent: Jan. 15, 1991

[54] RADIATION IMAGING PROCESS FOR FORMING PATTERN WITHOUT ALKALI-SOLUBLE POLYMER UNDERLAYER AND WATER SOLUBLE RADIATION-SENSITIVE DIAZONIUM SALT OVERLAYER

[75] Inventors: Shoichi Uchino, Hachioji, Japan; Takumi Ueno, Bonn, Fed. Rep. of Germany; Takao Iwayanagi, Tokyo, Japan; Saburo Nonogaki, Tokyo, Japan; Michiaki Hashimoto, Sayama, Japan

[73] Assignee: Hitachi, Ltd., Tokyo, Japan

[21] Appl. No.: 423,554

[22] Filed: Oct. 13, 1989

Related U.S. Application Data

[63] Continuation of Ser. No. 69,175, Jul. 2, 1987, abandoned.

[30] Foreign Application Priority Data

Jul. 4, 1986 [JP] Japan ................................ 61-156098

[51] Int. Cl.$^5$ .......................... G03F 7/021; G02F 7/30
[52] U.S. Cl. .................................. 430/325; 430/141; 430/145; 430/160; 430/162; 430/176; 430/311; 430/312
[58] Field of Search ............... 430/325, 145, 141, 312, 430/160, 162, 175, 176, 311

[56] References Cited

U.S. PATENT DOCUMENTS

| | | | |
|---|---|---|---|
| 2,649,373 | 8/1953 | Neugebauer et al. | 430/175 |
| 3,443,944 | 5/1969 | Wise | 430/198 |
| 3,733,200 | 5/1973 | Takaishi et al. | 430/160 |
| 3,869,292 | 3/1975 | Peters | 430/176 |
| 3,890,152 | 6/1975 | Ruckert et al. | 430/175 |
| 4,163,672 | 8/1979 | Stahlhofer | 430/191 |
| 4,197,128 | 4/1980 | Watanabe et al. | 430/156 |
| 4,472,494 | 9/1984 | Hallman et al. | 430/175 |
| 4,499,170 | 2/1985 | Amariti et al. | 430/175 |
| 4,554,236 | 11/1985 | Bentley et al. | 430/157 |
| 4,672,021 | 6/1987 | Blumel et al. | 430/312 |
| 4,804,614 | 2/1989 | Halle | 430/311 |

FOREIGN PATENT DOCUMENTS

| | | | |
|---|---|---|---|
| 161660 | 11/1985 | European Pat. Off. | 430/176 |
| 1493833 | 11/1977 | United Kingdom | 430/160 |
| 1493834 | 11/1977 | United Kingdom | 430/160 |

*Primary Examiner*—Charles L. Bowers, Jr.
*Attorney, Agent, or Firm*—Antonelli, Terry, Stout & Kraus

[57] ABSTRACT

A process for forming a pattern comprising forming an alkali-soluble polymer layer on a substrate, forming a radiation-sensitive composition layer containing a diazonium salt on the alkali-soluble polymer layer to form a resist layer having a two-layer structure, exposing the resist layer to a radiation to cause the change in solubility in an aqueous alkaline solution at the boundary between the two layers and forming a predetermined pattern in the resist layer by a usual resist process. The resist layer may comprise a plurality of layers comprising the two-layer structure as a repeating unit structure.

20 Claims, 1 Drawing Sheet

RADIATION IMAGING PROCESS FOR FORMING PATTERN WITHOUT ALKALI-SOLUBLE POLYMER UNDERLAYER AND WATER SOLUBLE RADIATION-SENSITIVE DIAZONIUM SALT OVERLAYER

This application is a Continuation application of application Ser. No. 07/069,175, filed July 2, 1987, abandoned.

BACKGROUND OF THE INVENTION

This invention relates to a process for forming a pattern used in fine fabrication of semiconductors in integrated circuits, large scale integrated circuits, etc. More particularly, the present invention is concerned with a process for forming a pattern which can afford a dry etching-resistant film having a high sensitivity and a high contrast with a simple resist construction.

At present, a projection aligner is mainly used in photolithography. However, when a pattern having a size of the order of submicrons is intended in this method, the contrast of an aerial image which has passed through an optical lens system is lowered, even if the contrast of a mask pattern is high. In particular, this tendency becomes more and more noticeable as the pattern size formed by the fine fabrication of semiconductors is reduced. In order to prevent this lowering in contrast, inorganic photoresist processes using a thin film of a chalcogenide glass have been proposed in, e.g., Oyo Butsuri (Applied Physics), vol. 50, No. 11, 1118–1130 (1981). An example of the inorganic photoresist processes comprises forming a thin silver layer as an upper layer of a chalcogenide (Se-Ge) layer through evaporation or electroless plating, doping the chalcogenide layer with silver through radiation exposure, and forming a pattern by taking advantage of the change in solubility of the chalcogenide layer in an alkali solution or the change in plasma etching resistance of the chalcogenide layer. This process for forming a pattern provides a contrast enhancement effect and enables the formation of a pattern having an extremely high contrast. However, in order to put this process for forming a pattern to practical use, it is necessary to solve the following problems. Specifically, it is necessary to lower by one order the dose of energy required for causing the change in solubility or etching resistance, to enable the film to be formed by a simpler method, e.g., spin coating, and to enhance the thermal stability of chalcogenide.

Meanwhile, since a photoresist which is now in practical use in fine fabrication of semiconductors comprises a mixed layer comprised of a sensitizer and a polymer, the sensitizer is uniformly dispersed in the photoresist layer. Therefore solvent solubilization or insolubilization reaction occurs substantially uniformly throughout the film by radiation exposure, which makes it impossible to improve the contrast. In order to improve the contrast, Japanese Patent Laid-Open No. 10642/1984 proposed contrast enhancement lithography (CEL process) which comprises forming a layer comprised of a non-water soluble polymer and arylnitron as an upper layer of the photoresist to improve the contrast of an image radiated on a resist.

However, the CEL process has a problem that the improvement in contrast leads to an increase in exposure.

Further, an EB (electron beam) lithography resist process used in the production of a mask for photolithography has a problem that a complicated three-layer resist should be applied to prevent the proximity effect caused by the scattering of an electron beam.

As mentioned above, the above-mentioned conventional process, i.e., the inorganic photoresist process, is accompanied by problems such as low sensitivity, necessity of complicated procedures for formation of a photoresist film, and low thermal stability of chalcogenide. Meanwhile, the photoresist process which is now in practical use has a problem that it is hardly expected to enhance the contrast without sacrificing the sensitivity. Further, in the electron beam lithography, the realization of a simplified resist construction is desired.

SUMMARY OF THE INVENTION

An object of the present invention is to provide a process for forming a pattern which can afford a pattern with a high contrast and a high sensitivity.

The above-mentioned and other objects of the present invention can be attained by a process which comprises forming an alkali-soluble polymer layer on a substrate, forming a radiation-sensitive composition layer containing a diazonium salt on the alkali-soluble polymer layer to form a radiation-sensitive resist layer having a two-layer structure, and forming a predetermined pattern in the radiation-sensitive layer through a pattern-forming resist process.

DETAILED DESCRIPTION OF PREFERRED EMBODIMENTS

This invention relates to a process for forming a pattern having a combination of a high contrast which is an advantage of the inorganic resist process with a high sensitivity which is an advantage of a photoresist which is now in practical use. The present invention will now be described with reference to the accompanying drawings.

Figure 1:
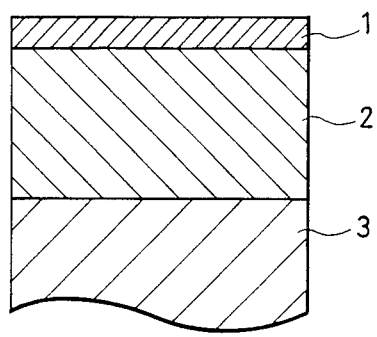
FIG. 1 is a typical view of a cross-sectional structure of a two-layer resist prepared in Example 1 according to the present invention.
Figure 2:
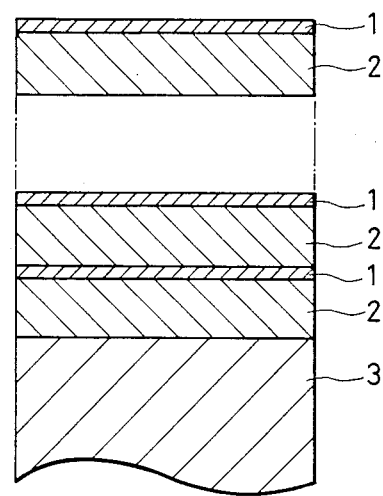
FIG. 2 is a typical view of a cross-sectional structure of a multi-layer resist.

As shown in FIG. 1, the process of the present invention comprises forming an alkali-soluble polymer layer comprised of an alkali-soluble phenolic resin on a substrate, forming a radiation-sensitive composition layer containing a diazonium salt as an upper layer of the alkali-soluble polymer layer to form a two-layer structure, and forming a pattern in the two-layer structure through a pattern forming process. As shown in FIG. 2, in the present invention, the radiation-sensitive resist layer may be of a multi-layer structure comprising a repetition of a fundamental unit structure comprised of the two-layer structure as shown in FIG. 1, and such a radiation-sensitive resist having a multi-layer structure can also provide a high sensitivity and a high contrast.

The substrate used in the present invention is a substance itself on which a fine pattern is to be formed.

The alkali-soluble polymer layer is formed of an alkali-soluble phenolic resin such as a poly(vinylphenol)

or novolac resin, a halogenide of the above-mentioned resin, or a composition comprised of two or more of these resins. The thickness of the alkali-soluble polymer layer is preferably 0.1 to 1 μm and more preferably 0.2 to 0.7 μm.

In the present invention, the radiation-sensitive composition layer is formed of a radiation-sensitive composition containing an aromatic diazonium salt including at least one member selected from among diazonium chloride-zinc chloride double salt, diazonium fluoroborate, diazonium sulfonate and diazonium sulfate, a water-soluble or alkali-soluble polymer, and the like. The content of the diazonium salt in the radiation-sensitive composition is preferably from 50 to 300 wt.%, more preferably from 80 to 150 wt.% based on the polymer. The thickness of the radiation-sensitive composition is preferably from 0.1 to 1 μm, more preferably from 0.2 to 0.7 μm.

The acquirement of a high contrast which is one of the advantages of the present invention can be achieved by separately providing the radiation-sensitive composition layer and the etching-resistant layer (alkali-soluble polymer layer) and causing a radiation-induced chemical reaction at the boundary between the two layers. The function of the technical means according to the present invention will now be described in detail.

A radiation-sensitive composition layer containing an organic diazonium salt represented by the following general formula (1) was formed as the upper layer of an alkali-soluble polymer layer containing an alkali-soluble phenolic resin, e.g., poly(vinylphenol) resin, novolac resin, cresol-novolac resin, or their halogenides, or at least two of them to form an exposure sample:

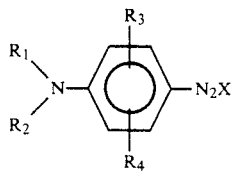  (1)

(wherein $R_1$, $R_2$, $R_3$, and $R_4$ are each independently stands for a hydrogen atom or an alkyl, alkoxy or aryl group and may be partially substituted with a hydroxyalkyl group; and X stands for an anion such as $Cl^-$, $BF_4^-$, $SO_3H^-$, or $SO_4^{2-}$ and wherein an N,N-dialkylamino group

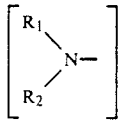

may be replaced with an alkoxy group such as a methoxy group [$CH_3O-$] or an ethoxy group [$C_2H_5O-$].)

The exposure of the exposure sample to ultraviolet rays brings about a remarkable decrease in solubility of the exposed area in an aqueous alkaline solution at the boundary between the radiation-sensitive composition layer containing a diazonium salt and the alkali-soluble phenolic resin layer. Therefore, a pattern can be formed by development with an aqueous alkaline solution. The mechanism of the decrease in the solubility of the exposed area in an alkaline solution is not yet fully elucidated. But, one of the causes is believed to be that the ultraviolet radiation leads to the formation of an alkali-insoluble layer comprised of a decomposition product of a diazonium salt and a phenolic resin. No clear evidence is yet found on whether the decomposition product is diffused into the phenolic resin layer.

As mentioned above, the characteristic features of the present invention reside in that a radiation-sensitive composition layer having a small thickness is used to utilize a remarkable difference in solubility between the exposed area and the unexposed area caused at the boundary between the radiation-sensitive composition layer and the alkali-soluble phenolic resin layer and that a diazonium salt having an extremely high sensitivity to radiation is used. Therefore, the process for forming a pattern according to the present invention comprising a two-layer structure enables a resist process suitable for formation of a fine pattern and having a combination of the advantage of the conventional inorganic resist process with the advantage of the photoresist process which are now in practical use.

Further, the application of the present invention to the EB resist process enables the formation of a fine pattern having a high contrast, because the electron beam-sensitive composition layer is thin and is provided apart from the substrate and, therefore, hardly undergoes an influence of a proximity effect attributable to the scattering caused within the resist and an electron beam scattered from the substrate.

The present invention will now be described in more detail with reference to examples.

Example 1

A silicon wafer was spin-coated with a 15wt.% cyclohexane solution of poly(vinylphenol) (Maruzen Resin M manufactured by Maruzen Oil, Co., Ltd.) to form an about 1 μm-thick poly(vinylphenol) layer and baked at 140° C. for 20 min. Then, a 0.25 μm-thick radiation-sensitive composition layer containing the aromatic diazonium salt listed in Table 1 was formed as the upper layer of the poly(vinylphenol) layer using an aqueous solution having the following composition 1. The product thus formed was used as an exposure sample. The cross-sectional structure of the exposure sample is shown in FIG. 1.

TABLE 1

| No. | Chemical name | Structural formula | Contrast value (γ value) i-line | g-line |
|---|---|---|---|---|
| 1 | 4-(N,N-dimethylamino)-benzenediazonium chloride-zinc chloride | $(CH_3)_2N-\bigcirc-N_2ClZnCl_2$ | 2.3 | 2.3 |

TABLE 1-continued

| No. | Chemical name | Structural formula | Contrast value (γ value) i-line | g-line |
|---|---|---|---|---|
| 2 | 4-(N,N-diethylamino)-benzenediazonium chloride-zinc chloride | $(C_2H_5)_2N-\bigcirc-N_2ClZnCl_2$ | 3.5 | — |
| 3 | 4-(N,N-di-n-propylamino)-benzenediazonium chloride-zinc chloride | $(C_3H_7)_2N-\bigcirc-N_2ClZnCl_2$ | 2.7 | — |
| 4 | 4-(N,N-dimethylamino)-2-methoxy-benzenediazonium chloride-zinc chloride | $(CH_3)_2N-\bigcirc(OCH_3)-N_2ClZnCl_2$ | 3.1 | — |
| 5 | 4-(N,N-dimethylamino)-2-methylbenzenediazonium chloride-zinc chloride | $(CH_3)_2N-\bigcirc(CH_3)-N_2Cl\tfrac{1}{2}ZnCl_2$ | 4.9 | — |
| 6 | 4-(N,N-dimethylamino)-2,5-dimethyl-benzenediazonium chloride-zinc chloride | $(CH_3)_2N-\bigcirc(CH_3)(CH_3)-N_2Cl\tfrac{1}{2}ZnCl_2$ | 3.3 | 6.0 |
| 7 | 4-(N,N-dimethylamino)-2,5-dimethyl-benzenediazonium fluoroborate | $(CH_3)_2N-\bigcirc(CH_3)(CH_3)-N_2BF_4$ | — | 2.9 |
| 8 | 4-(N,N-dimethylamino)-2,6-dimethyl-benzenediazonium chloride-zinc chloride | $(CH_3)_2N-\bigcirc(CH_3)(CH_3)-N_2Cl\tfrac{1}{2}ZnCl_2$ | 2.1 | — |
| 9 | 4-(N,N-diethylamino)-2-methyl-benzenediazonium chloride-zinc chloride | $(C_2H_5)_2N-\bigcirc(CH_3)-N_2Cl\tfrac{1}{2}ZnCl_2$ | 4.2 | — |
| 10 | 4-(N-ethyl-N-hydroxy-ethylamino)-benzenediazonium chloride-zinc chloride | $C_2H_5-N(C_2H_4OH)-\bigcirc-N_2Cl\tfrac{1}{2}ZnCl_2$ | 3.2 | — |
| 11 | 4-(N,N-dimethylamino)-3-ethoxy-benzenediazonium chloride-zinc chloride | $(CH_3)_2N-\bigcirc(OC_2H_5)-N_2Cl\tfrac{1}{2}ZnCl_2$ | — | 3.1 |

TABLE 1-continued

Figure 3:
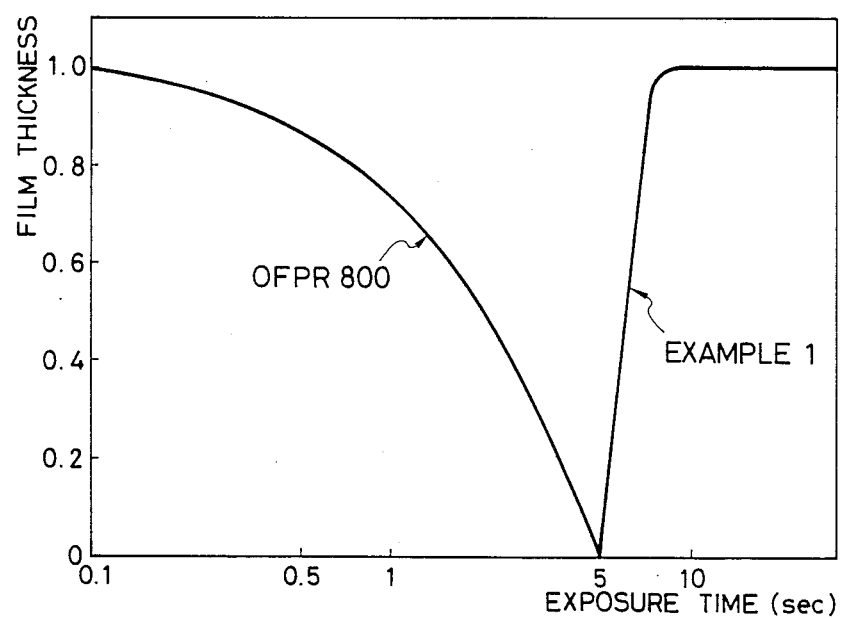
FIG. 3 is a graph showing the photosensitive characteristics as determined by using a g-line (436 nm) of a two-layer resist prepared in Example 1 according to the present invention.

| No. | Chemical name | Structural formula | Contrast value (γ value) | |
|---|---|---|---|---|
| | | | i-line | g-line |
| 12 | 4-(N,N-dimethylamino)-3-methoxy-benzenediazonium chloride-zinc chloride | $(CH_3)_2N-\bigcirc-N_2Cl\cdot\frac{1}{2}ZnCl_2$ with OCH$_3$ substituent | — | 2.8 |
| 13 | 4-(N,N-dimethylamino)-naphthalenediazonium chloride-zinc chloride | $(CH_3)_2N-\bigcirc\bigcirc-N_2Cl\cdot\frac{1}{2}ZnCl_2$ | — | 2.6 | composition 1
- diazonium salt No. 6 of Table 1    5 wt. %
- N-vinylpyrrolidone/vinyl acetate copolymer    5 wt. %
- hydrochloric acid    1 wt. %
- surfactant (Pluronic L-92 manufactured by Asahi Denka Kogyo K.K.)    0.01 wt. %
- water    the balance The exposure sample as shown in FIG. 1 was exposed to rays of light emitted from a XE-Hg lamp manufactured by Xanovia Co., Ltd. through a VY-43 filter (g-line) or UVD2 filter (i-line) manufactured by Toshiba Corporation for varied exposure times. The exposed sample was then washed with water to remove the radiation-sensitive layer and was immersed in an aqueous solution containing 1 wt.% of tetramethylammonium hydroxide for 45 sec to conduct development. After completion of the development, the film thickness of the sample for each exposure time was determined to evaluate the photosensitive characteristics. The sensitivity curve thus obtained are shown in FIG. 3. As can be seen from FIG. 3, the sample exhibits a high contrast and a sensitivity comparable to that of an AZ positive photoresist (OFPR800 manufactured by Tokyo Ohka Kogyo Co., Ltd.), i.e., it has excellent photosensitive characteristics. A fine pattern was transferred on the above exposure sample using a g-line reduction projection aligner RA501 manufactured by Hitachi Ltd. As a result, a pattern having a high resolution could be formed.

Further, excellent photosensitive characteristics could also be attained when diazonium salt Nos. 1 to 13 listed in Table 1 were used instead of the aromatic diazonium salt No. 6 in the above-mentioned composition 1. The γ-values obtained in exposure with i-line (i.e., with a UVD2 filter) and g-line (i.e., with a VY43 filter) are shown in the column of the contrast value (γ-value).

Example 2

Water-soluble polymers as shown in the following compositions 2 to 5 were used instead of the N-vinylpyrrolidone/vinyl acetate copolymer of the composition 1 of Example 1. As a result, it was found that the samples had photosensitive characteristics equal to those of the sample of Example 1.

composition 2
- diazonium salt No. 6 listed in Table 1    3 wt. %
- polyvinyl alcohol (Kuraray Poval 224 manufactured by Kuraray Co., Ltd.)    3 wt. %
- hydrochloric acid    1 wt. %
- surfactant (Pluronic L-92)    0.01 wt. %
- water    the balance composition 3
- diazonium salt No. 6 listed in Table 1    2 wt. %
- poly(N-vinylpyrrolidone)(K-90 manufactured by GAF Corp.)    2 wt. %
- hydrochloric acid    1 wt. %
- surfactant (Pluronic L-92)    0.01 wt. %
- water    the balance composition 4
- diazonium salt No. 6 listed in Table 1    2 wt. %
- acrylamide/diacetoneacrylamide copolymer    2 wt. %
- hydrochloric acid    1 wt. %
- surfactant (Pluronic L-92)    0.01 wt. %
- water    the balance composition 5
- diazonium salt No. 6 listed in Table 1    2 wt. %
- propylene glycol alginate    2 wt. %
- hydrochloric acid    1 wt. %
- surfactant (Pluronic L-92)    0.01 wt. %
- water    the balance Example 3

The photosensitive characteristics of an exposure sample were evaluated in the same manner as in Example 1, except that a layer which has been prepared by coating a silicon wafer with a diazoquinone positive photoresist (OFR800 manufactured by Tokyo Ohka Kogyo K.K.) in a thickness of 0.8 μm, baking the coating at 80° C. for 20 min and exposing the coating to rays of light emitted from a Xe-Hg lamp to completely decompose the photosensitizer was used instead of the layer used in Example 1 and that a 2.38 wt.% aqueous solution of tetramethylammonium hydroxide was used as the developing solution. As a result, it was found that the sample had excellent photosensitive characteristics.

Example 4

The photosensitive characteristics of an exposure sample were evaluated in the same manner as in Example 1, except that a Maruzen Resin M/hydroxyethyl methacrylate copolymer was used instead of Maruzen Resin M used in Example 1. As a result, it was found that the exposure sample had excellent photosensitive characteristics.

Example 5

A silicon wafer was spin-coated with a 20 wt.% ethyl Cellosolve acetate solution of a cresol novolac resin to form an about 0.6 μm-thick cresol novolac resin layer, and the resulting layer was baked at 80° C. for 1 min. Then, a 0.35 μm-thick radiation-sensitive composition layer containing a diazonium salt was formed as the upper layer of the cresol novolac resin layer using an aqueous solution containing the following composition 6, thereby obtaining an exposure sample.

The photosensitive characteristics of the exposure sample was evaluated in the same manner as in Example 1, except that a UVD2 filter was used in the exposure and that a 2.38 wt.% aqueous solution of tetramethylammonium hydroxide was used as the developing solution. As a result, it was found that the exposure sample had excellent photosensitive characteristics.

| composition 6 | diazonium salt No. 4 listed in Table 1 | 4 wt. % |
| --- | --- | --- |
| | N-vinylpyrrolidone/vinyl acetate copolymer | 5 wt. % |
| | acetic acid | 50 wt. % |
| | water | the balance |

Excellent photosensitive characteristics could also be attained when diazonium salt Nos. 1 to 13 were used instead of the diazonium salt No. 4 listed in Table 1 in the above-mentioned composition 6.

Example 6

The photosensitive characteristics of an exposure sample was evaluated in the same manner as in Example 5, except that a novolac resin was used instead of a cresol novolac resin as used in Example 5. As a result, it was found that the exposure sample had excellent photosensitive characteristics.

Example 7

The exposure sample prepared in Example 1 was exposed to an electron beam using a Hitachi Electron Beam Exposure System in varied radiation doses. Thereafter, the sample was developed with a 0.8 wt.% aqueous solution of tetramethylammonium hydroxide for 4 min. After completion of the development, the film thickness of the sample for each radiation dose was determined to prepare an electron beam sensitivity curve. The evaluation of the electron beam-sensitive characteristics was conducted using this curve. As a result, it was found that the sample had excellent electron beam-sensitive characteristics.

Example 8

The same procedures as those in Examples 1 to 7 were repeated, except that the development with the aqueous tetramethylammonium hydroxide solution was conducted without removal of the radiation-sensitive composition layer after exposure. As a result, it was found that excellent photosensitive characteristics were attained as in the case where the development was conducted after removal of the radiation-sensitive layer.

As is apparent from the foregoing description, the simplified pattern-forming process based on a two-layer structure according to the present invention enables the formation of a fine pattern having a high sensitivity and a high contrast, which advantageously leads to improvements in accuracy of fine fabrication and production efficiency in the production of a semiconductor device.

What is claimed is:

1. A process for forming a pattern comprising forming an alkali-soluble polymer layer on a substrate; forming a radiation-sensitive composition layer, containing a radiation-sensitive composition including an admixture of (1) a radiation-sensitive aromatic diazonium salt, and (2) an organic polymer, on said alkali-soluble polymer layer, thereby providing a boundary between the alkali-soluble polymer layer and the radiation-sensitive composition layer, to form a radiation-sensitive resist layer having a two-layer structure, the organic polymer of the radiation-sensitive composition being a water-soluble polymer, the radiation-sensitive composition layer and alkali-soluble polymer layer being such layers that solubility, to an aqueous alkaline solution, of exposed areas at the boundary between the alkali-soluble polymer layer and the radiation-sensitive composition layer is decreased, as compared to solubility of unexposed areas at the boundary; and forming a predetermined pattern in said radiation-sensitive resist layer by a pattern-forming process, said forming including exposing the two-layer structure to radiation to decrease solubility of the exposed structure to an aqueous alkaline solution at the boundary between the radiation-sensitive composition layer and the alkali-soluble polymer layer, removing the radiation-sensitive composition layer by washing with water, and then developing the exposed structure with an aqueous alkaline solution so as to remove unexposed portions of the two-layer structure, without removing exposed portions, due to the decreased solubility of the exposed structure, to an aqueous alkaline solution, at said boundary, so as to form the predetermined pattern.

2. A process according to claim 1, wherein at least one pair of resist layers having said two-layer structure are further formed on said resist layer prior to said pattern-forming process.

3. A process according to claim 1, wherein said alkali-soluble polymer layer comprises an alkali-soluble phenolic resin.

4. A process according to claim 3, wherein the alkali-soluble phenolic resin is selected from the group consisting of poly (vinylphenol), novolac resin and halogenides of poly (vinylphenol) and novolac resin.

5. A process according to claim 4, wherein the alkali-soluble polymer layer has a thickness of 0.1 to 1 μm.

6. A process according to claim 5, wherein the radiation-sensitive composition layer has a thickness of 0.1 to 1 μm.

7. A process according to claim 1, wherein the aromatic diazonium salt has the general formula:

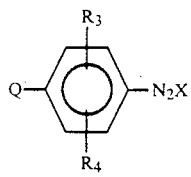

where $R_1$, $R_2$, $R_3$ and $R_4$ are each independent and are selected from the group consisting of hydrogen, alkyl, alkoxy and aryl, and alkyl, alkoxy and aryl partially substituted with hydroxyalkyl; X is an anion selected from the group consisting of $Cl^-$, $BF_4^-$, $SO_3H^-$ and $SO_4^{2-}$; and Q is

$R_1$ and $R_2$ having been previously defined, or an alkoxy group.

8. A process according to claim 7, wherein Q is an alkoxy group, the alkoxy group being selected from the group consisting of a methoxy group and an ethoxy group.

9. A process according to claim 7, wherein said exposing the two-layer structure causes formation of a radiation-induced reaction product of the material of the radiation-sensitive composition layer and of the alkali-soluble polymer layer at the boundary between the two layers.

10. A process according to claim 7, wherein $R_1$, $R_2$, $R_3$ and $R_4$ are each independent and are selected from the group consisting of hydrogen, methyl, ethyl, propyl, methoxy, ethoxy and hydroxyethyl.

11. A process according to claim 1, wherein said aromatic diazonium salt contained in said radiation-sensitive composition layer contains at least one member selected from the group consisting of diazonium chloride-zinc chloride double salt, diazonium fluoroborate, diazonium sulfonate and diazonium sulfate.

12. A process according to claim 1, wherein said exposing the two-layer structure causes formation of a radiation-induced reaction product of the material of the radiation-sensitive composition layer and of the alkali-soluble polymer layer at the boundary between the two layers.

13. A process according to claim 12, wherein the radiation-sensitive composition layer is relatively thin as compared to the thickness of the alkali-soluble polymer layer.

14. A process according to claim 1, wherein the substrate is a silicon wafer.

15. A process according to claim 1, wherein the radiation-sensitive composition layer is relatively thin as compared to the thickness of the alkali-soluble polymer layer.

16. A process for forming a pattern comprising forming an alkali-soluble polymer layer on a substrate; forming a radiation-sensitive composition layer, containing a radiation-sensitive composition including an admixture of (1) a radiation-sensitive aromatic diazonium salt, and (2) an organic polymer, on said alkali-soluble polymer layer, whereby a boundary is provided between the alkali-soluble polymer layer and the radiation-sensitive composition layer, to form a radiation-sensitive resist layer having a two-layer structure, the aromatic diazonium salt having the general formula:

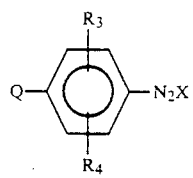

where $R_1$, $R_2$, $R_3$ and $R_4$ are each independent and are selected from the group consisting of hydrogen, alkyl, alkoxy and aryl, and alkyl, alkoxy and aryl partially substituted with hydroxyalkyl; X is an anion selected from the group consisting of $Cl^-$, $BF_4^-$, $SO_3H^-$ and $SO_4^{2-}$; and Q is

$R_1$ and $R_2$ having been previously defined, or an alkoxy group, the organic polymer being a water-soluble polymer; and forming a predetermined pattern in the radiation-sensitive resist layer by a pattern-forming process, said forming including exposing the two-layer structure to radiation to decrease solubility of the exposed structure to an aqueous alkaline solution at the boundary between the radiation-sensitive composition layer and the alkali-soluble polymer layer, removing the radiation-sensitive composition layer by washing with water, and then developing the exposed structure with an aqueous alkaline solution so as to remove unexposed portions of the two-layer structure, without removing exposed portions, due to the decreased solubility of the exposed structure, to an aqueous alkaline solution, at said boundary, so as to form the predetermined pattern.

17. A process according to claim 16, wherein the substrate is a silicon wafer.

18. A process according to claim 16, wherein said exposing the two-layer structure causes formation of a radiation-induced reaction product of the material of the radiation-sensitive composition layer and of the alkali-soluble polymer layer at the boundary between the two layers.

19. A process according to claim 16, wherein $R_1$, $R_2$, $R_3$ and $R_4$ are each independent and are selected from the group consisting of hydrogen, methyl, ethyl, propyl, methoxy, ethoxy and hydroxyethyl.

20. A process according to claim 14, wherein the radiation-sensitive composition layer is relatively thin as compared to the thickness of the alkali-soluble polymer layer.

* * * * *